(12) United States Patent
Becker et al.

(10) Patent No.: US 11,333,678 B2
(45) Date of Patent: May 17, 2022

(54) METHOD FOR OFFSET CALIBRATION OF A YAW RATE SENSOR SIGNAL OF A YAW RATE SENSOR, SYSTEM AND COMPUTER PROGRAM

(71) Applicant: Robert Bosch GmbH, Stuttgart (DE)

(72) Inventors: Hanna Becker, Reutlingen (DE); Juergen Gut, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/260,404

(22) PCT Filed: Sep. 26, 2019

(86) PCT No.: PCT/EP2019/076018
§ 371 (c)(1),
(2) Date: Jan. 14, 2021

(87) PCT Pub. No.: WO2020/078687
PCT Pub. Date: Apr. 23, 2020

(65) Prior Publication Data
US 2021/0263066 A1  Aug. 26, 2021

(30) Foreign Application Priority Data

Oct. 18, 2018 (DE) .......................... 102018217814.3

(51) Int. Cl.
*G01P 15/08* (2006.01)
*G01D 1/16* (2006.01)
(Continued)

(52) U.S. Cl.
CPC ............ *G01P 15/0802* (2013.01); *G01D 1/02* (2013.01); *G01D 1/12* (2013.01); *G01D 1/16* (2013.01);
(Continued)

(58) Field of Classification Search
CPC ........ G01P 15/0802; G01D 1/02; G01D 1/12; G01D 1/16; G01D 1/18; G06F 17/10;
(Continued)

(56) References Cited

U.S. PATENT DOCUMENTS 4,122,503 A * 10/1978 Allan .................... G11B 5/5565
360/78.05
4,972,357 A * 11/1990 Morel ................ H03H 17/0664
708/313
(Continued)

FOREIGN PATENT DOCUMENTS

DE  WO 2012130540   *  4/2012  ............. G01C 19/56
EP       1221586 A2      7/2002
(Continued)

OTHER PUBLICATIONS

International Search Report for PCT/EP2019/076018, dated Jan. 3, 2020.

*Primary Examiner* — Alexander Satanovsky
(74) *Attorney, Agent, or Firm* — Norton Rose Fulbright US LLP; Gerard Messina

(57) ABSTRACT

A method for offset calibration of a rotation rate sensor signal of a rotation rate sensor. In a first step, an ascertainment is made that the rotation rate sensor is in an idle state. In a second step, after the first step, a filter parameter is determined as a function of the measured rotation rate sensor values, measured in the idle state, of the rotation rate sensor. In a third step, after the second step, a filtered measured rotation rate sensor value is determined with the aid of the filter parameter. An offset is determined with the aid of the filtered measured rotation rate sensor value.

11 Claims, 1 Drawing Sheet

(51) Int. Cl.
*G06F 17/17* (2006.01)
*G01D 1/18* (2006.01)
*G06F 17/18* (2006.01)
*H03H 17/06* (2006.01)
*H04B 1/00* (2006.01)
*G06Q 10/04* (2012.01)
*G01D 1/02* (2006.01)
*G06F 17/10* (2006.01)
*H04L 43/028* (2022.01)
*G01D 1/12* (2006.01)
*H03H 17/04* (2006.01)

(52) U.S. Cl.
CPC ............... *G01D 1/18* (2013.01); *G06F 17/10* (2013.01); *G06F 17/17* (2013.01); *G06F 17/18* (2013.01); *G06F 2201/805* (2013.01); *G06Q 10/04* (2013.01); *H03H 17/045* (2013.01); *H03H 17/0664* (2013.01); *H04B 1/0021* (2013.01); *H04B 1/0046* (2013.01); *H04L 43/028* (2013.01)

(58) Field of Classification Search
CPC .... G06F 17/17; G06F 17/18; G06F 2201/805; G06Q 10/04; H03H 17/045; H03H 17/0664; H04B 1/0021; H04B 1/0046; H04L 43/028; G01C 19/5776; G01C 25/005

See application file for complete search history.

(56) References Cited

U.S. PATENT DOCUMENTS

| | | | |
|---|---|---|---|
| 8,548,766 | B2 | 10/2013 | Judd |
| 9,778,040 | B1 | 10/2017 | Iascone et al. |
| 2011/0172820 | A1 | 7/2011 | Kim et al. |
| 2011/0301900 | A1* | 12/2011 | Patel ................ G01C 25/00 702/104 |
| 2012/0323520 | A1 | 12/2012 | Keal |

FOREIGN PATENT DOCUMENTS

| | | | | |
|---|---|---|---|---|
| GB | WO 2017042578 | * | 3/2017 | ........... G01C 21/165 |
| WO | 2012130540 A1 | | 10/2012 | |

* cited by examiner

METHOD FOR OFFSET CALIBRATION OF A YAW RATE SENSOR SIGNAL OF A YAW RATE SENSOR, SYSTEM AND COMPUTER PROGRAM

FIELD

The present invention relates to a method for offset calibration of a rotation rate sensor signal of a rotation rate sensor. The present invention further relates to a system for calibrating an offset of a rotation rate sensor signal of a rotation rate sensor, and to a computer program encompassing instructions.

BACKGROUND INFORMATION

Rotation rate sensors, in particular having microelectromechanical systems, are used in a wide variety of sectors. They are utilized, for example, in the field of electronic consumer goods as part of smartphones or so-called "wearables." With them, the orientation of the device in space can be determined, the rotation rate sensor signal usually being integrated for that purpose. When the rotation rate sensor is in the motionless state, the rotation rate sensor signal should be zero. Typically, however, such rotation rate sensors have production-related offsets in their signals. This results in systematic errors, in particular drifts, when the rotation rate sensor signal is integrated, which have a negative effect on orientation estimation. Orientation errors of 180° can quickly occur within a few minutes. A correction of the rotation rate offset is necessary in order to avoid such drift. Because the offsets can change during operation of the sensor and over its lifetime, for example as a result of temperature influences, factory precalibration in the context of manufacture of the sensor generally does not produce the desired avoidance of offsets.

Conventional methods for calibrating a rotation rate offset are available in the related art.

U.S. Pat. No. 8,548,766 B2, for example, describes a sensor platform having at least a gyroscope, an acceleration sensor, and a magnetometer. A compensation for the gyroscope is determined with the aid of measured values of the acceleration sensor and of the magnetometer. U.S. Patent Application Publication No. US 2011 0301900 A1 describes a lookup table in which temperature values and associated zero rotation rate offsets are present.

Conventional methods are disadvantageous, however, in that in some cases they are difficult and expensive to implement and, for example, require the presence of several different types of sensors on one chip system. On the other hand, with many conventional systems it is difficult or even impossible to enable efficient offset correction for rotation rate sensors in different utilization environments, for example rotation rate sensors in a mobile telephone, which typically is regularly placed immovably on a desk or the like, and a rotation rate sensor in a wearable which, even in its idle position, is still exposed to considerable noise due to slight movements by the wearer.

SUMMARY

An object of the present invention is to furnish a method for offset calibration of a rotation rate sensor signal of a rotation rate sensor which makes possible rapid and reliable offset correction for different utilization environments of a rotation rate sensor.

The method according to the present invention for offset calibration of a rotation rate sensor signal of a rotation rate sensor, in accordance with an example embodiment, may have the advantage as compared with the related art that the filter parameter is adapted to the idle-state conditions of the rotation rate sensor. It is, thus, possible to ascertain and use a different filter parameter, for example, for a rotation rate sensor that is (almost) entirely motionless in the idle state than for a sensor that is still exposed to slight movements and fluctuations even in the idle state. Even for a single sensor, the filter can advantageously be adapted to the instantaneous conditions of the idle state. It is correspondingly possible for the filtering time to be adapted to the idle-state conditions and thereby optimized. For example, a shortened time for offset ascertainment can thus be used for an (entirely) motionless sensor with low noise, with the result that a more precise correction and adaptation to changing temperature conditions can be achieved. For a sensor that is still exposed to considerable movement even in the idle state, conversely, by way of the ascertainment of the filter parameter it is possible to increase the time for offset ascertainment in order to better compensate for increased noise and, here as well, arrive at an appropriate offset correction.

In particular, the offset determined according to the present invention can be used subsequently for offset correction or offset calibration of the rotation rate sensor signal.

According to an example embodiment of the present invention, the offset of the rotation rate sensor signal can also be understood as a "shift" of the rotation rate sensor signal.

The rotation rate sensor signal encompasses, in particular, a plurality of measured rotation rate sensor values that are ascertained or generated successively at a rate (sampling rate) by the rotation rate sensor and outputted.

The rotation rate sensor can have one or several measurement axes, in particular one, two, or three axes. The rotation rate sensor signal and the measured rotation rate sensor values can correspondingly each encompass values for all measurement axes of the sensor.

Advantageous refinements and embodiments of the present invention are described herein.

Because of the fact that in the first step, an ascertainment is made, with the aid of an estimated average of measured rotation rate sensor values and/or with the aid of an estimated fluctuation value of measured rotation rate sensor values, that the rotation rate sensor is in the idle state, the estimated fluctuation value preferably corresponding to an estimated variance, according to an embodiment of the present invention it is advantageously possible to ascertain reliably that the rotation rate sensor is in the idle state, i.e., is being moved very little or not at all. The estimated fluctuation value is preferably an estimated maximum variance or fluctuation of the measured rotation rate sensor values. It is possible in particular for the estimated average and/or the estimated fluctuation value (or the estimated variance) to be respectively ascertained or estimated with the aid of a smoothing filter. In this case it is possible for the estimated average and/or the estimated variance not to correspond exactly to the average and/or the variance of the measured values.

Because of the fact that the result of the ascertainment in the first step is that the rotation rate sensor is in the idle state when the estimated average is less than a first threshold value and/or the estimated variance is less than a second threshold value, according to an embodiment of the present invention it is possible for a particularly advantageous idle state ascertainment to be implementable. Preferably, for a specific number of (most recent) measured rotation rate sensor values, the estimated average and the estimated variance (or maximum fluctuation) is calculated with the aid of a smoothing filter. Particularly preferably, it is possible for the idle state to be identified when the estimated average is less than a first threshold value, thr1, and the estimated variance is less than a second threshold value, thr2. Preferably the subsequent steps of the method are carried out only with the rotation rate sensor in the idle state.

Because of the fact that the measured rotation rate sensor values measured in the idle state encompass only those measured rotation rate sensor values which have been measured since the rotation rate sensor has been in the idle state, the measured rotation rate sensor values measured in the idle state preferably being used in the third step in the determination of the filtered measured rotation rate sensor value, in particular in the determination of the filtered measured rotation rate sensor values, according to an embodiment of the present invention it is possible for only those measured values which were measured with the rotation rate sensor in the idle state to be taken into account in the context of offset correction, and in particular in the context of ascertainment of the filter parameter.

Because of the fact that the filter parameter is determined in the second step as a function of a first intermediate parameter and of a second intermediate parameter, the first intermediate parameter being proportional to the reciprocal of a number of measured rotation rate sensor values measured in the idle state, the second intermediate parameter being a function of a fluctuation of measured rotation rate sensor values measured in the idle state, the fluctuation preferably being the estimated variance, according to an embodiment of the present invention it is possible to perform a particularly advantageous adaptation of the filter parameter (and thus of the correction method as a whole) to the conditions and external influences on the rotation rate sensor in the idle state.

In particular, according to an embodiment of the present invention, the first intermediate parameter, a1, can be ascertained as follows:

$$a1=1/\#Z,$$

where #Z is the number of measured rotation rate sensor values measured in the idle state, or the number of samples used for calibration. The second intermediate parameter, a2, can particularly preferably be ascertained in such a way that the range from 0 to the second threshold value, thr2, i.e., in particular from 0 to the maximum variance or fluctuation, is subdivided into several intervals or sub-regions. For example, an interval can be furnished for each typical noise level that occurs in various wearable calibration situations. A fixed value for the second intermediate parameter is assigned to each interval. The second intermediate parameter thus receives the value assigned to the interval into which the ascertained (maximum) fluctuation or variance falls in the idle state.

Because of the fact that the filter parameter corresponds to the maximum of the first and the second intermediate parameter, according to an embodiment of the present invention, a particularly advantageous ascertainment of the filter parameter can be accomplished, both the fluctuation and the number of measured rotation rate sensor values measured in the idle state being capable of being taken into account. It is thus possible, for example, to carry out both a particularly rapid and precise offset calibration for a rotation rate sensor that exhibits only slight noise in the idle state, and a comparatively somewhat slower but nevertheless precise offset calibration for a rotation rate sensor that exhibits elevated noise.

Because of the fact that in the third step, the filtered measured rotation rate sensor value is furthermore ascertained, in particular with the aid of an exponential smoothing, as a function of a previous filtered measured rotation rate sensor value and of an instantaneous measured rotation rate sensor value, according to an embodiment of the present invention it is possible to achieve a particularly advantageous offset calibration.

It is possible in particular to use the following correlation in the third step:

$$\bar{x}[n]=(1-a)\bar{x}[n-1]+ax[n],$$

where $\bar{x}[n]$ is the filtered measured rotation rate sensor value, a is the filter parameter, $\bar{x}[n-1]$ is the previous filtered measured rotation rate sensor value, $x[n]$ is the instantaneous measured rotation rate sensor value, n numbers the measured rotation rate sensor values or the filtered measured rotation rate sensor values. The previous filtered measured rotation rate sensor value is preferably determined in a previous iteration of the third step or of the second and third steps or of the first, second, and third steps analogously (to determination of the filtered measured rotation rate sensor value). Correspondingly, an exponential smoothing with a parameter, the filter parameter a, can be accomplished in the third step. Other filtering methods for the third step are also suitable in principle.

Because of the fact that after the third step an output rate, in particular a sampling rate, of the filtered measured rotation rate sensor values is reduced with the aid of a decimator device so that reduced-output-rate filtered measured rotation rate sensor values are generated, according to an embodiment of the present invention it is possible for the output rate of the offset to be capable of being reduced and, in particular, to be independent of the measurement rate or sampling rate of the measured rotation rate sensor values.

Because of the fact that in a fifth step, after the third step and in particular after the fourth step, the offset is determined with the aid of the filtered measured rotation rate sensor value or with the aid of the reduced-output-rate filtered measured rotation rate sensor value, and further with the aid of a smoothing filter, according to an embodiment of the present invention it is possible for a further smoothing to take place in the context of the offset calibration. For example, slight fluctuations of the estimated value (i.e., of the filtered measured rotation rate sensor value or of the reduced-output-rate filtered measured rotation rate sensor value) can be reduced. In this case the offset preferably corresponds to the value obtained after the smoothing filter. A wide variety of methods are suitable as smoothing filters, for example exponential smoothing. Several filtered measured rotation rate sensor values or reduced-output-rate filtered measured rotation rate sensor values (from several iterations of the third and/or the fourth step) are typically used in the context of smoothing in the fifth step.

According to an embodiment of the present invention, it is possible for the third step, preferably the second and the third step, particularly preferably the first, the second, and the third step, more preferably the first, the second, the third, and the fourth step, and even more preferably the first, the second, the third, the fourth, and the fifth step, to be repeated several times, in particular in such a way that a plurality of filtered measured rotation rate sensor values are generated in the third steps. Continuous adaptation of the offset calibration is thereby possible.

A further subject of the present invention is a system for offset calibration of a rotation rate sensor signal of a rotation rate sensor. In accordance with an example embodiment of the present invention, the system is embodied in such a way that an ascertainment is made that the rotation rate sensor is in an idle state; the system being embodied in such a way that a filter parameter is determined as a function of measured rotation rate sensor values of the rotation rate sensor which are measured in the idle state; the system being embodied in such a way that a filtered measured rotation rate sensor value is determined with the aid of the filter parameter; the system being embodied in such a way that an offset is determined with the aid of the filtered measured rotation rate sensor value.

A further subject of the present invention is a computer program encompassing instructions that, upon execution of the computer program by a computer and/or by a system according to an embodiment of the present invention, cause the computer and/or the system to execute a method according to an embodiment of the present invention.

The features, embodiments, and advantages that have been described in connection with the method according to the present invention for offset calibration of a rotation rate sensor signal of a rotation rate sensor, or in connection with an embodiment of the method according to the present invention, can be utilized for the system according to the present invention and for the computer program according to the present invention. The features, embodiments, and advantages that have been described in connection with the system according to the present invention, the computer program according to the present invention, or in connection with an embodiment of the system according to the present invention or in connection with an embodiment of the computer program according to the present invention, can be utilized for the method according to the present invention for offset calibration of a rotation rate sensor signal of a rotation rate sensor.

Exemplifying embodiments of the present invention are depicted in the figures and are explained in further detail in the description below.

DETAILED DESCRIPTION OF EXAMPLE EMBODIMENTS

Figure 1:
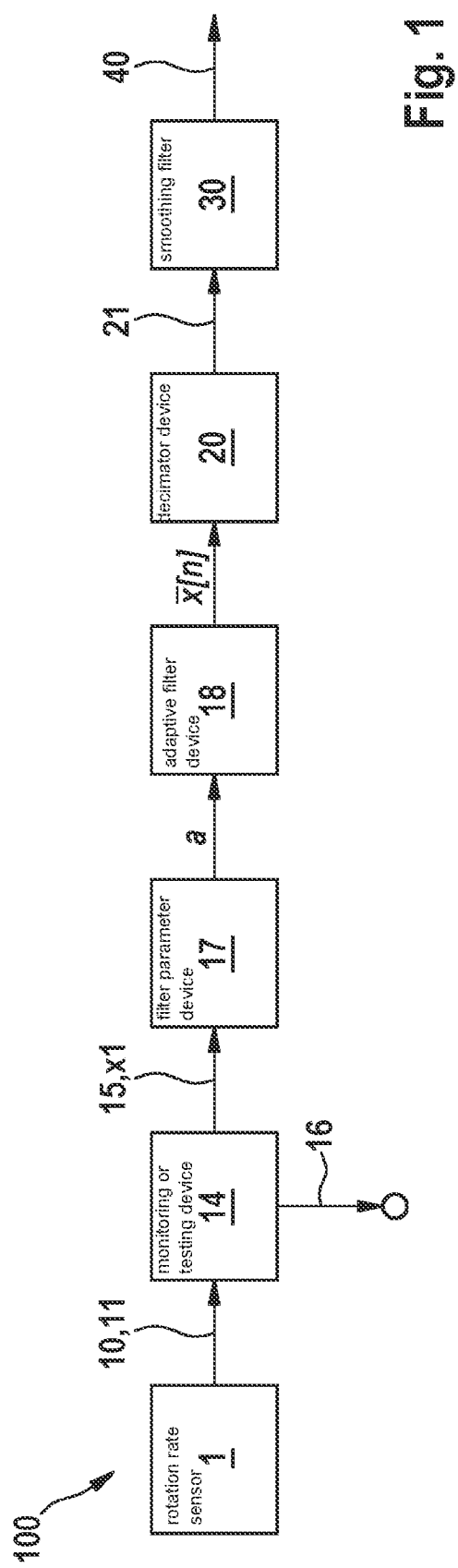
FIG. 1 is a schematic block diagram of a system for offset calibration of a rotation rate sensor signal of a rotation rate sensor, according to an embodiment of the present invention.

In the various Figures, identical parts are always labeled with the same reference characters and are therefore as a rule also each mentioned or named only once.

FIG. 1 is a schematic block diagram of a system 100 for offset calibration of a rotation rate sensor signal 11 of a rotation rate sensor 1, according to an embodiment of the present invention. A rotation rate sensor 1 supplies a rotation rate sensor signal 11 that encompasses a sequence of measured rotation rate sensor values 10. That signal is made available to a monitoring device 14 or testing device 14. Monitoring device 14 identifies, on the basis of measured rotation rate sensor values 10 that have been obtained, whether rotation rate sensor 1 is in an idle state 15 or in a non-idle state 16 or movable state 16. For this, monitoring device 14 estimates an estimated average of measured rotation rate sensor values 10 and an estimated fluctuation value, in particular an estimated variance, of measured rotation rate sensor values 10, preferably with the aid of a smoothing filter. If the estimated average is less than a first threshold value, thr1, and the estimated variance is less than a second threshold value, thr2, monitoring device 14 ascertains that rotation rate sensor 1 is in the idle state. The first and/or second threshold value thr1, thr2 are definable, and can be selected in accordance with requirements. If the result of the ascertainment is that rotation rate sensor 1 is in non-idle state 16, no further calibration steps are carried out. If the result of the ascertainment is, conversely, that rotation rate sensor 1 is in idle state 15, calibration is continued, a filter parameter a being determined, with the aid of a filter parameter device 17, as a function of measured rotation rate sensor values x1 of rotation rate sensor 1 which are measured in idle state 15. Measured rotation rate sensor values x1 that are measured in idle state 15 encompass only those measured rotation rate sensor values 10 which were measured since rotation rate sensor 1 was in, or had transitioned into, idle state 15. A possible exemplifying embodiment of the determination of filter parameter a, or an embodiment of filter parameter device 17, is explained in FIG. 2. With the aid of filter parameter a that has been obtained, a filtered measured rotation rate sensor value $\bar{x}[n]$ is then determined in an adaptive filter device 18. A possible exemplifying embodiment of the determination of filtered measured rotation rate sensor value $\bar{x}[n]$, or an embodiment of filter device 18, is explained in FIG. 2. Once the filtered measured rotation rate sensor value $\bar{x}[n]$ has been determined, it is made available to a decimator device 20. With the aid of decimator device 20, an output rate, in particular a sampling rate, of the filtered measured rotation rate sensor values, $\bar{x}[n], \bar{x}[n-1]$, is reduced, so that reduced-output-rate filtered measured rotation rate sensor values 21 are furnished. A smoothing of the reduced-output-rate filtered measured rotation rate sensor values 21 is then accomplished with the aid of a smoothing filter 30. The result is to determine offset 40 with which rotation rate sensor signal 11 can be corrected or calibrated. Smoothing filter 30 can encompass, for example, an exponential smoothing. Alternatively, however, other filtering techniques are also possible. Alternatively, it would also be possible to obtain offset 40 directly from the filtered measured rotation rate sensor value x[n] or to use the latter as offset 40. Direct utilization of reduced-output-rate filtered measured rotation rate sensor values 21 as offset 40 would also be alternatively possible.

Figure 2:
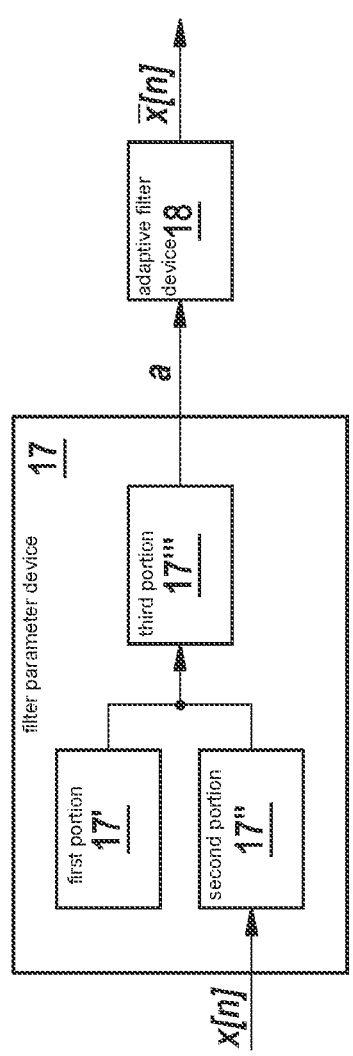
FIG. 2 is a schematic block diagram of part of a system for offset calibration, according to an embodiment of the present invention.

FIG. 2 is a schematic block diagram of part of a system 100 for offset calibration, according to an embodiment of the present invention. It depicts in particular an embodiment of filter parameter device 17. In a first portion 17' of filter parameter device 17, first intermediate parameter a1 is ascertained by way of the correlation a1=1/#Z, where #Z is the number of measured rotation rate sensor values x1 measured in idle state 15 since the first sample in idle state 15, or the number of samples used for calibration. In a second portion 17" of filter parameter device 17, second intermediate parameter a2 is ascertained in such a way that the range from 0 to the second threshold value thr2 (i.e., in particular, the range from 0 to the maximum variance of measured rotation rate sensor values 10), is subdivided into several intervals or sub-regions. For example, an interval can be furnished for each typical noise level that occurs in various wearable calibration situations. A fixed value for second intermediate parameter a2 is assigned to each interval. Second intermediate parameter a2 thus receives the value assigned to the interval into which the ascertained (maximum) fluctuation or variance of measured rotation rate sensor values x1 measured in idle state 15 (or of the several axes of the rotation rate sensor signal) falls. Second intermediate parameter a2 is thus based on the noise power level of rotation rate sensor 1.

In a third portion 17''' of filter parameter device 17, filter parameter a is then ascertained from first and second intermediate parameters a1, a2 and is selected in particular as a=max(a1, a2). It is possible in general for first, second, and third portions 17', 17", 17''' to be capable of being implemented as one shared functionality. The ascertained filter parameter a can then be made available to adaptive filter device 18. Filtered measured rotation rate sensor value x̄[n] is ascertained with the aid of adaptive filter device 18. An exponential smoothing can be used by adaptive filter device 18, in particular the correlation:

$$\bar{x}[n]=(1-a)\bar{x}[n-1]+ax[n],$$

where x̄[n] is the filtered measured rotation rate sensor value, a is the filter parameter, x̄[n−1] is the previous filtered measured rotation rate sensor value, x[n] is the instantaneous measured rotation rate sensor value, n describes the number of the measured rotation rate sensor value or the filtered measured rotation rate sensor value. The previous filtered measured rotation rate sensor value x̄[n−1] is preferably determined in a previous iteration analogously to the above-described determination of the filtered measured rotation rate sensor value x̄[n]. Filters other than the exponential smoothing described above are also possible for adaptive filter device 18.

With the aid of the example embodiment described in FIGS. 1 and 2 of a system 100, a method for offset calibration of a rotation rate sensor signal 11 of a rotation rate sensor 1 can be carried out, in a first step, an ascertainment being made that rotation rate sensor 1 is in an idle state;

in a second step, after the first step, a filter parameter a being determined as a function of measured rotation rate sensor values x1, measured in idle state 15, of rotation rate sensor 1;

in a third step, after the second step, a filtered measured rotation rate sensor value x[n] being determined with the aid of filter parameter a;

an offset 40 being determined with the aid of filtered measured rotation rate sensor value x̄[n].

It is advantageously possible for offset 40 to be used subsequently for offset correction or offset calibration of rotation rate sensor signal 11.

What is claimed is:

1. A rotation rate sensor comprising a micro-electromechanical system (MEMS) device and a processor configured to cause the rotation rate sensor to output sensor readings due to and representing effects of rotation states on the MEMS device of the rotation rate sensor, wherein:

a correspondence of the output sensor readings to reactions of the MEMS device to the rotation states changes over time due to a continual self-calibration of the rotation rate sensor that changes an offset applied to signals produced as the reactions of the MEMS device to the rotation states;

the continual self-calibration is performed by the rotation rate sensor using the processor to:

in a first step, ascertain that the rotation rate sensor is in an idle state; and conditional upon that the rotation rate sensor has been determined in the first step to be in the idle state, update the offset by which the rotation rate sensor outputs the sensor readings in response to subsequent effects of the rotation states on the MEMS device, the update including, while the rotation rate sensor in in the ascertained idle state:

in a second step, after the first step, determining a filter parameter as a function of the signals produced by the MEMS device in the idle state of the rotation rate sensor;

in a third step, applying the filter parameter determined in the second step to obtain a filtered version of the signals produced by the MEMS device in the idle state; and determining an updated value of the offset from the filtered version of the signals produced by the MEMS device in the idle state; and at least one of the following:

(a) the determining of the filter parameter in the second step includes categorizing a degree of idleness of the rotation rate sensor during the idle state into one of a plurality of predefined idleness categories based on the signals produced by the MEMS device during the idle state and setting the filter parameter to a value that depends on the one of the plurality of predefined idleness categories into which the degree of idleness has been categorized; and (b) the applying of the filter parameter in the third step includes applying the filter parameter on an individual basis to a single one of the signals produced by the MEMS device during the idle state.

2. The rotation rate sensor as recited in claim 1, wherein the filter parameter is determined in the third step on a condition that no signal used for the filter parameter determination has been produced by the MEMS device in a non-idle state one of the rotation rate sensor.

3. The rotation rate sensor as recited in claim 1, wherein the third step is performed as a function of a previous filtered one of the signals produced by the MEMS device and of an instantaneous one of the signals produced by the MEMS device, using an exponential smoothing.

4. The rotation rate sensor as recited in claim 1, wherein in a fourth step, after the third step and prior to the determining of the updated value of the offset, an output rate at which the signals are obtained for the determining of the update value of the offset is reduced using a decimator device, thereby reducing a number of the signals that are used for the determining of the updated value.

5. The rotation rate sensor as recited in claim 4, wherein the determining of the updated value of the offset is performed by applying a smoothing filter to output of the decimator device.

6. The rotation rate sensor as recited in claim 1, wherein the determining of the filter parameter in the second step includes the categorizing the degree of idleness of the rotation rate sensor during the idle state into one of the plurality of predefined idleness categories based on the signals produced by the MEMS device during the idle state and the setting the filter parameter to the value that depends on the one of the plurality of predefined idleness categories into which the degree of idleness has been categorized.

7. The rotation rate sensor as recited in claim 1, wherein the applying of the filter parameter in the third step includes the applying of the filter parameter on an individual basis to the single one of the signals produced by the MEMS device during the idle state.

8. The rotation rate sensor as recited in claim 7, wherein the applying of the filter parameter on an individual basis to the single one of the signals includes multiplying the single one of the signals by the filter parameter.

9. The rotation rate sensor as recited in claim 8, wherein:
the filter parameter is applied by determining $\bar{x}[n]=(1-\alpha)\bar{x}[n-1]+ax[n]$;
'a' is the filter parameter;
x[n] is the single one of the signals;
$\bar{x}[n-1]$ is a previously filtered version of a prior one of the signals; and
$\bar{x}[n]$ is a filtered version of the single one of the signals.

10. A rotation rate sensor comprising a micro-electromechanical system (MEMS) device and a processor configured to cause the rotation rate sensor to output sensor readings due to and representing effects of rotation states on the MEMS device of the rotation rate sensor, wherein:
a correspondence of the output sensor readings to reactions of the MEMS device to the rotation states changes over time due to a continual self-calibration of the rotation rate sensor that changes an offset applied to signals produced as the reactions of the MEMS device to the rotation states;
the continual self-calibration is performed by the rotation rate sensor using the processor to:
in a first step, ascertain that the rotation rate sensor is in an idle state; and
conditional upon that the rotation rate sensor has been determined in the first step to be in the idle state, update the offset by which the rotation rate sensor outputs the sensor readings in response to subsequent effects of the rotation states on the MEMS device, the update including, while the rotation rate sensor in in the ascertained idle state:
in a second step, after the first step, determining a filter parameter as a function of the signals produced by the MEMS device in the idle state of the rotation rate sensor;
in a third step, applying the filter parameter determined in the second step to obtain a filtered version of the signals produced by the MEMS device in the idle state; and
determining an updated value of the offset from the filtered version of the signals produced by the MEMS device in the idle state;
the filter parameter is determined in the second step as a function of a first intermediate parameter and of a second intermediate parameter;
the first intermediate parameter is proportional to a reciprocal of a number of the signals produced by the MEMS device in the idle state; and
the second intermediate parameter is a function of a fluctuation of values of the signals produced by the MEMS device in the idle state.

11. The rotation rate sensor as recited in claim 10, wherein the filter parameter corresponds to a maximum of the first intermediate parameter and the second intermediate parameter.

\* \* \* \* \*